United States Patent [19]
Tanaka et al.
[11] 4,200,814
[45] Apr. 29, 1980

[54] MULTIPLIER WITH HALL ELEMENT

[75] Inventors: Shikei Tanaka, Chigasaki; Tetsuji Kobayashi; Noboru Matsuo, both of Yokohama; Haruo Takahashi, Kawasaki, all of Japan

[73] Assignee: Tokyo Shibaura Electric Co., Ltd., Kawasaki, Japan

[21] Appl. No.: 849,416

[22] Filed: Nov. 7, 1977

[30] Foreign Application Priority Data

| | | | |
|---|---|---|---|
| Nov. 5, 1976 | [JP] | Japan | 51-132875 |
| Nov. 5, 1976 | [JP] | Japan | 51-132876 |
| Nov. 5, 1976 | [JP] | Japan | 51-132877 |
| Nov. 5, 1976 | [JP] | Japan | 51-132878 |
| Nov. 5, 1976 | [JP] | Japan | 51-132879 |
| Nov. 5, 1976 | [JP] | Japan | 51-132881 |

[51] Int. Cl.[2] ........ H03K 17/90
[52] U.S. Cl. ........ 307/309; 324/117 H; 323/94 H; 328/160
[58] Field of Search ........ 307/309; 324/117 H, 324/251; 357/27; 323/94 H

[56] References Cited

U.S. PATENT DOCUMENTS

| | | | |
|---|---|---|---|
| 2,545,369 | 3/1951 | Millar | 307/309 |
| 3,121,788 | 2/1964 | Hilbinger | 307/309 |
| 3,525,041 | 8/1970 | Velsink | 324/251 |
| 3,622,898 | 11/1971 | Salmon | 307/309 |
| 3,718,861 | 2/1973 | Ramsey, Jr. | 324/142 |
| 3,823,354 | 7/1974 | Janssen | 357/27 |

*Primary Examiner*—Stanley D. Miller, Jr.
*Assistant Examiner*—B. P. Davis
*Attorney, Agent, or Firm*—Oblon, Fisher, Spivak, McClelland & Maier

[57] ABSTRACT

A multiplier with Hall element is provided with a Hall element with a pair of control current input terminals and a pair of Hall output terminals, means by which current is converted into magnetic field and the converted magnetic field is applied to the Hall element, and at the same time the voltage to be multiplied by the current is converted into control current and the converted control current is fed to control current input terminals, and a differential amplifier circuit including first and second operational amplifiers having non-inverted input terminals connected to the Hall output voltage terminals, and a third operational amplifier having non-inverted and inverted input terminals to which the output of the first and second operational amplifier is applied. The differential amplifier circuit removes the in-phase components of the Hall output voltage and then amplifies it.

16 Claims, 19 Drawing Figures

MULTIPLIER WITH HALL ELEMENT

The invention relates to a multiplier with the Hall element for obtaining the product of current and voltage and, more particularly, the one suitable for watt-hour meter (or integrating instruments).

Watt-hour meters widely used at present are generally classified into DC type watt-hour meters and AC type watt-hour meters. Induction type watt-hour meters, mercury-motor type watt-hour meters, commutator-motor type watt-hour meters are enumerated for the DC type watt-hour meter and induction type watt-hour meter for the AC type watt-hour meter. These watt-hour meters are so constructed that the torque by the motor is proportional to the product of current and voltage, i.e. power to be measured. That is, the motor is driven at speed proportional to such a torque and the amount of the motor rotation is integrated. With such a precise mechanism, these watt-hour meters have acquired some inherent problems such as measurement errors and thus poor reliability. The chief sources of the error are demagnetization of the magnet for speed fine adjustment, and friction of rotational parts such as the bearings of the rotor. Additionally, a complex signal converter is necessary when meters are automatically checked from a remote center station. The best measurement precision of approximately 0.5% is perhaps the upper limit of the precision for the currently used watt-hour meters further suffering disadvantage of being bulky and heavy.

Accordingly, a primary object of the present invention is to provide a multiplier realizing watt-hour meters in which the Hall element is used as means for obtaining the product of current and voltage, and its construction is relatively simple and operable with high precision and reliability.

According to one aspect of the invention, there is provided a multiplier comprising: a power-voltage converter including at least one Hall element with a pair of control current input terminals and a pair of Hall output voltage terminals, means for converting input current into magnetic field and applying the magnetic field into the Hall element and means for converting input voltage to multiplied by the input current into control current and for feeding the control current to the control current input terminals; and differential amplifier circuit in which in-phase components in the output voltage fed from the power-voltage converter is removed and amplified.

Other objects and features of the invention will be apparent from the following description taken in connection with the accompanying drawings, in which.

Figure 8:
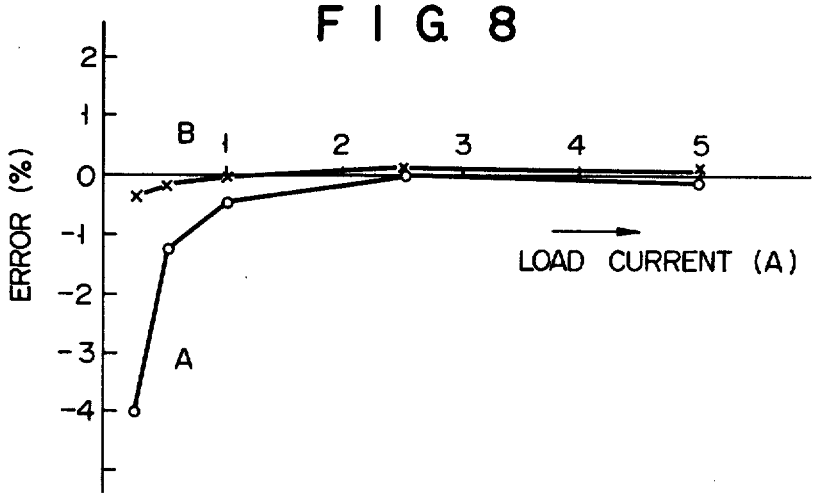
Figure 9:
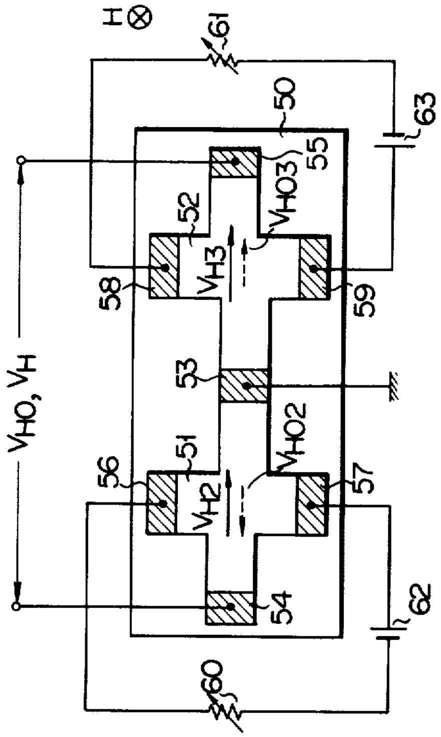
Figure 16:
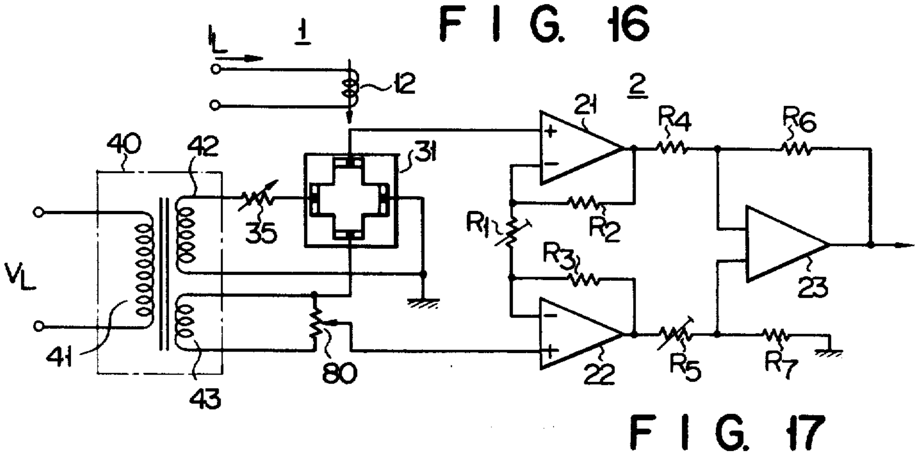
Figure 17:
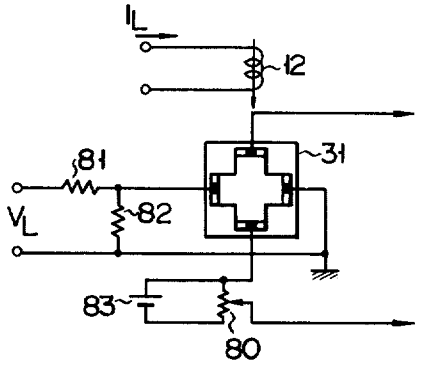

FIG. 8 graphically illustrates the variation of Hall output error with respect to load current;

FIG. 9 schematically illustrates two Hall elements fabricated on a substrate;

FIGS. 10 through 15 schematically show other modifications of the Hall elements arrangement shown in FIG. 9;

FIG. 16 shows a circuit diagram of a modification of the power-voltage converter which is applicable for the multiplier according to the present invention;

FIG. 17 shows a modification of the embodiment of FIG. 16; and

Figure 18:
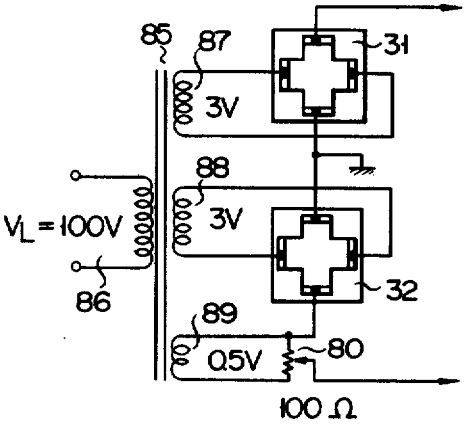
Figure 19:
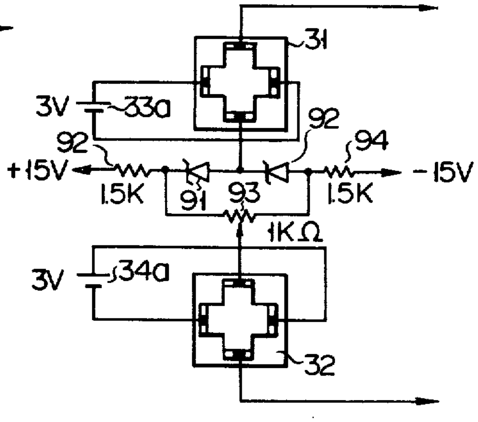

FIGS. 18 and 19 shows other modifications of the power-voltage converters according to the invention.

Figure 1:
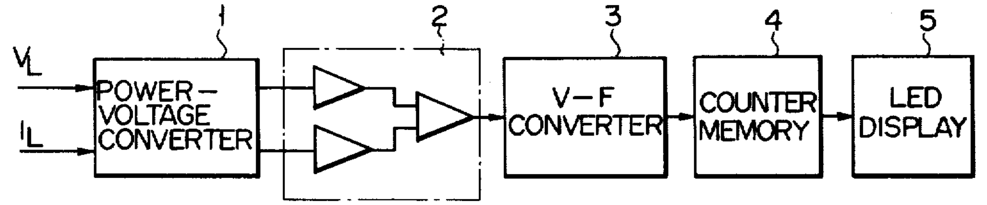
FIG. 1 shows a block diagram of a watt-hour meter with a multiplier using the Hall element embodying the invention.

The invention will be given by using a watt-hour meter into which the invention is incorporated. Referring now to FIG. 1, there is shown a watt-hour meter using a current-voltage multiplier according to the invention. As shown, a load current $I_L$ and a load voltage $V_L$ are applied to the multiplier 1 or a power-voltage converter where these are multiplied eath other. More precisely, in the power-voltage converter 1, the load current $I_L$ and the load voltage $V_L$ are converted into a control current and a magnetic field, respectively, and then these converted are applied to a Hall element in the converter 1. Upon the application of them, the Hall element produces at the output a Hall output voltage proportional to the input power, i.e. $I_L \times V_L$. The Hall output voltage fed from the power-voltage converter 1 is fed to a differential amplifier circuit 2 comprising, for example, three operational amplifiers 21, 22 and 23, where they are amplified with removal of the in-phase components of them. The output voltage of the differential amplifier circuit 2 is subsequently fed to a voltage-frequency (V-F) converter 3 where it is converted into a train of pulses with the frequency corresponding to the output voltage. These pulses are then counted and stored by and in a counter memory 4 and the counted ones are visualized by a light emission diode (LED) display 5. The value displayed indicates the product of the load current $I_L$ and the load voltage $V_L$, the consumed power. The counter memory 4 may be constructed by using, for example, a non-volatile semiconductor memory or a mechanical type counter using a stepping motor and related components.

In FIG. 1, the portion including the power-voltage converter 1 and the differential amplifier 2 relates to the multiplier with the Hall element of the invention. The detail of the multiplier will be given with reference to FIG. 2. In the figure, the power-voltage converter 1 includes a coil 12 for developing a magnetic field corresponding to the load current $I_L$ and applying it onto a Hall element 11, and a transformer 13 for feeding the control current corresponding to the load voltage $V_L$ to the control current input terminals of the Hall element 11. The transformer 13 has the primary winding receiving the load voltage $V_L$ and the secondary winding. The current induced in the secondary winding is applied to the control current input terminal of the Hall element 11, via a variable resistor 14 for restricting properly the induced current flowing therethrough.

As known, the Hall element is generally fabricated in such a manner that the epitaxial layer of an n-type GaAs is grown on a GaAs substrate and then the layer is subjected to the called photo-etching to form a pair of control current terminals and a pair of Hall output terminals. The Hall element used as the one 11 has, for example, the Hall output voltage $V_H$ of 22 mV/Kg.mA and a resistance R of 1,200 ohms between the Hall output voltage terminals. The flowing of the load current $I_L$ through the coil 12 with the number of turns T of 18 of which the electromagnet is provided with the Hall element attached thereto, applies a bias magnetic field to the Hall element 11. The load voltage $V_L$ is reduced by the transformer to a low voltage, say, several volts to feed the control current to the Hall element, through the variable resistor 14 of approximately 3 KΩ.

In more particular, when power is consumed at the load (not shown), the load current $I_L$ flows into the coil 12 so that the electromagnet develops the magnetic field proportional to the load current $I_L$ to be applied, as the bias magnetic field, to the Hall element 11. The transformer 13 feeds the current proportional to the load voltage $V_L$ to the control current terminals of the Hall element 11. Thus, the control current proportional to the load voltage $V_L$ flows into the Hall element 11. Under this condition, the Hall element 11 produces at the output terminals the product of the intensity of the bias magnetic field and the magnitude of the bias current, i.e. the Hall output voltage $V_H$ of the consumed power which is the product of the control current $I_L$ and the load voltage $V_L$.

The Hall output voltage $V_H$ is then applied to the differential amplifier including three operational amplifiers 21, 22 and 23 and with a high input impedance. Generally, a considerably high input impedance is possible in the non-inverted amplifier. For this reason, a pair of the Hall output voltage terminals of the Hall element 11 are connected to the non-inverted input terminals of the operational amplifiers 21 and 22. The outputs of the non-inverted operational amplifiers 21 and 22 are connected to the input terminals of the differential amplifier 23, through resistors $R_4$ and $R_5$, respectively. The output of the operational amplifier 21 is fed back to the inverted input terminal via a resistance $R_2$. Likewise, the output of the operational amplifier 22 is fed back to the inverted input terminal via a resistor $R_3$. A variable resistor $R_1$ is connected between these inverted input terminals of the respective amplifiers. Changing the resistance of the variable resistor $R_1$ enables the gain of differential amplifier circuit 2 to be adjusted. The output of the differential amplifier 23 is fed back to one of the input terminals thereof via a variable resistor $R_6$ and also is connected to the input terminal of the V-F converter 3. The other input terminal of the differential amplifier 23 and the connection point of the variable resistor $R_5$ is earthed via a resistor $R_7$. The power source terminals of the differential amplifier 23 are connected with +15 V and −15 V terminals of a power source, respectively.

In this embodiment, the resistances of the respective resistors are as follows: $R_1$=10 KΩ (variable), $R_2$=10 KΩ, $R_4$=3 KΩ, $R_5$=3.5 KΩ (variable), $R_6$=10 KΩ (variable), and $R_7$=10 KΩ.

Assume now that one of the control current terminals of the Hall element 11 is placed at the ground potential, the respective Hall output voltage terminals are at the potentials $e_1$ and $e_2$ and the output terminals of the non-inverted amplifiers 21 and 22 are at the potentials $e_3$ and $e_4$. The potentials $e_3$ and $e_4$ are given by equations (1) and (2)

$$e_3 = \left(1 + \frac{R_1}{R_2}\right)e_1 - \frac{R_2}{R_1}e_2 \qquad (1)$$

$$e_4 = \left(1 + \frac{R_3}{R_1}\right)e_2 - \frac{R_3}{R_1}e_1 \qquad (2)$$

The difference between the output voltages of the non-inverted amplifiers 21 and 22, as designated by $e_0$, is given by the difference between equations (1) and (2). Thus, one can write $$e_0 = e_3 - e_4 = (e_1 - e_2)\left(1 + \frac{R_2 + R_3}{R_1}\right) \qquad (3)$$

In the equation (3), $(e_1 - e_2)$ indicates the Hall output voltage $V_H$.

As seen from the equation (3), the resistors $R_1$ to $R_3$ is independent of common-mode rejection ratio (CMRR) of the differential amplifier circuit 2. That is, the gain of the circuit may be adjusted by $(R_2+R_3)/R_1$. In this case, when the gain is adjusted by changing the resistor $R_1$, the change of the resistor does not adversely influence the CMRR because the Hall output voltages $e_1$ and $e_2$ are not related to coefficients relating to the variable factors $R_1$, $R_2$ and $R_3$.

By using the thus constructed differential amplifier circuit 2, the gain of the power-voltage converter may be adjusted through the change of the variable resistor $R_1$ without any deterioration of the CMRR. Accordingly, the resistor $R_1$ may be used as a rated adjustor of the watt-hour meter constructed as shown in FIG. 1. The adjustment of the CMRR of this circuit 2 is possible by varying the resistance of the resistor $R_4$ or $R_5$.

As seen from the foregoing description, the consumed power of the single phase load may be digitally measured with a high precision. Additionally, unlike the conventional watt-hour meter, the one according to the invention has no mechanical rotational parts and therefore is durable with high reliability. Particularly, it is suitable for the automatic meter check (remote measurement).

Figure 2:
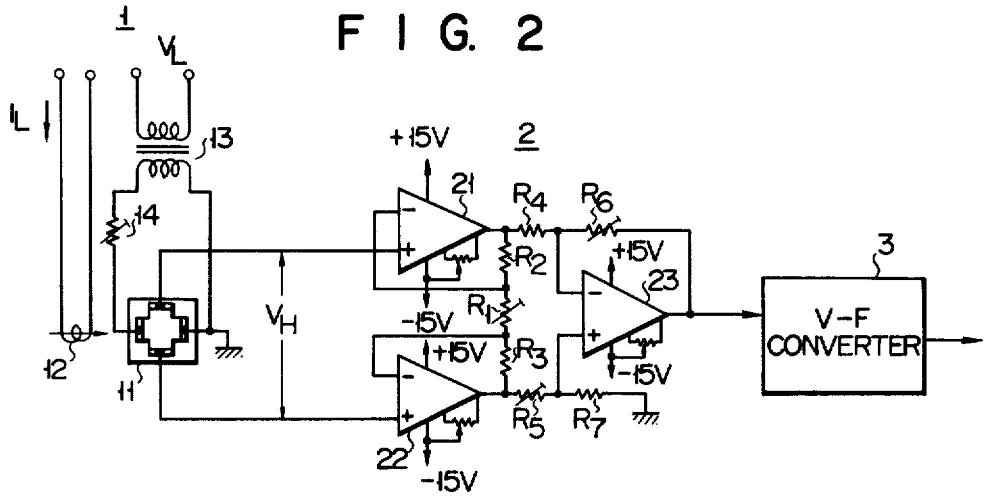
FIG. 2 shows a circuit diagram of an embodiment of a multiplier with a Hall element according to the present invention.

The above-mentioned embodiment was designed for measuring the single phase power; however, the replacement of the transformer 13 in FIG. 2 by a resistor permits it to be used for the DC power measurement.

Figure 3:
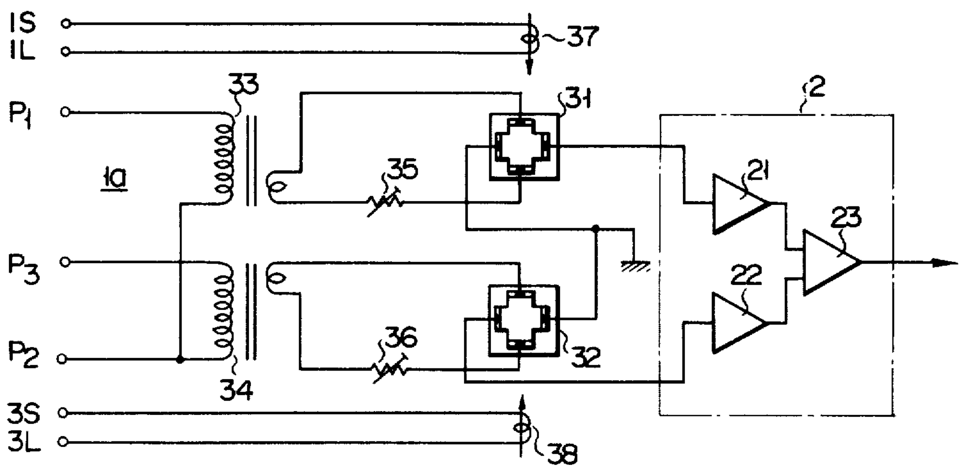
FIG. 3 shows a circuit diagram of another embodiment of a multiplier with Hall elements according to the present invention.

The watt-hour meter for polyphase (for example, N-phase) is also possible with an arrangement that the power-voltage converters using N−1 Hall elements are provided and the output voltages of the respective Hall elements are coupled in series. The example shown in FIG. 3 is a circuit diagram of a power-voltage converter 1a for measuring the three-phase electric power. This circuit uses two Hall elements since N=3 and the necessary Hall elements are N−1, 2. As shown, a Hall element 31 is connected at the control current terminals to the secondary side of a transformer 33, via a variable resistor 35. Another Hall element 32 is connected at the control current terminals to the secondary side of a transformer 34, via a variable resistor 36. One of the terminals of the primary winding of the transformer 33 is connected to the $P_1$ phase of the three-phase load while the terminal of the primary to the $P_2$ phase. In the transformer 34, one of the terminals of the primary is connected to the $P_3$ phase while the other terminal to the $P_2$ phase. The interphase voltage between the phases $P_1$ and $P_2$ is converted into a control current through the transformer 33 and a variable resistor 35 and the control current is fed to the control current input terminals of the Hall element 31. The interphase voltage between the phases $P_2$ and $P_3$ are converted into a control current through the transformer 34 and a variable resistor 36 and the control current is fed to the control current input terminals of the Hall element 32. The current flowing between a power source terminal $1_S$ and a load terminal $1_L$ energizes a coil 37 of an electric magnet to develope a magnetic field which in turn is applied as a bias voltage to the Hall element 31. Similarly, the current flowing between a power source terminal $3_S$ and a load terminal $3_L$ energizes a coil 38 of an electromagnet to develope a magnetic field which in turn is applied as a bias voltage to the Hall element 32. One of the Hall output terminals of the Hall element 31 is connected with the non-inverted amplifier 21 of the differential amplifier circuit 2 while the other Hall output terminal to the ground and to one of the Hall output terminals of the Hall element 32. The other Hall output terminal of the Hall element 32 is connected with the input terminal of the non-inverted amplifier 22. That is, the output voltages of the Hall elements 31 and 32 are summed and then is applied to the differential amplifier circuit 21, as in the case of FIG. 2. In this manner, the differential amplifier circuit 2 produces the voltage corresponding to the three-phase power to be measured, the in-phase components of which are removed.

In the embodiment of FIG. 3 if the two Hall elements are such that their misalignment voltages are cancelled to each other, the measuring precision in the light load region is improved.

Figure 4:
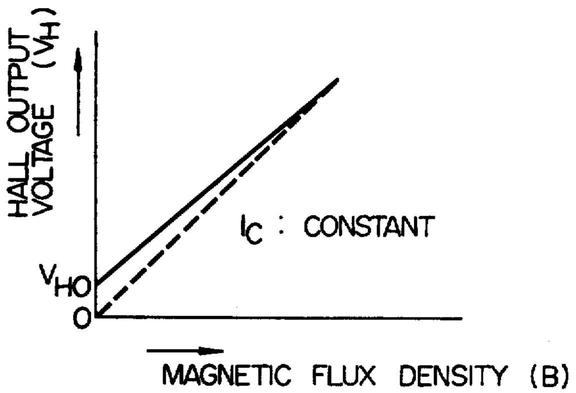
FIG. 4 shows a graph tracing the relation of Hall output voltage vs. magnetic flux density of a general Hall element.

The explanation to follow is the details of the cancelling operation of the misalignment voltages. The FIG. 4 shows the general relation between the Hall output voltage ($V_H$) and the magnetic flux density (B) of the bias magnetic field of a single Hall element, which the relation is well known. The graph of FIG. 4 is plotted with a constant value of the control current ($I_C$). Ideally, the Hall output voltage ($V_H$) is zero when the magnetic flux density (B) is zero, as indicated by a dotted line. In actuality, however, some Hall output voltage $V_{HO}$ appears when the magnetic flux density is zero, as indicated by a continuous line. This voltage $V_{HO}$ is called the misalignment voltage. A watt-hour meter is assumed to be designed using a single Hall element of which the control current is proportional to the load voltage to be measured and the magnetic flux density is proportional to the load current. In such a case, the misalignment voltage causes some voltage to appear at the Hall output when the magnetic flux density is zero, leading to measuring error. The error is produced even in the vicinity of zero of the load current.

Figure 5:
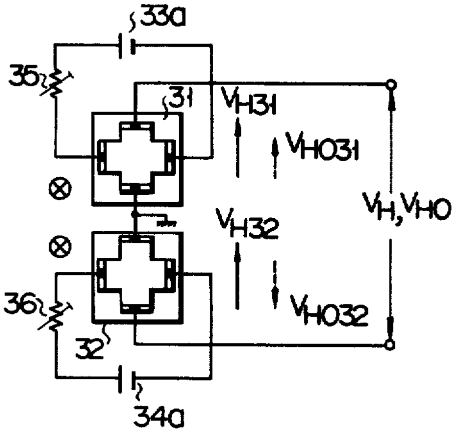
FIG. 5 shows a circuit diagram of still another modification of the power-voltage converter for the multiplier according to the present invention.

For this reason, when two hall elements are placed in a magnetic field and the misalignment voltages are different in polarity, these elements are connected in series as shown in FIG. 5, as they stand. On the other hand, if the misalignment voltages exhibit the same polarity, the direction of the control current of one of the Hall elements is inverted and the outputs of the Hall elements are connected in series.

The embodiment of FIG. 5 places two Hall elements in a magnetic field into which the currents flow in the same direction, from DC power sources 33a and 34a through variable resistors 35 and 36, respectively. Under this condition, the total misalignment voltage $V_{HO}$ when the magnetic field is zero is the sum of the misalignment voltages $V_{HO31}$ and $V_{HO32}$ of the Hall elements 31 and 32. However, these misalignment voltages of the respective Hall elements are opposite in polarity so that the total misalignment voltage $V_{HO}$ is extremely small. Note here that the respective misalignment voltages $V_{HO31}$ and $V_{HO32}$ and thus it permits the control currents fed to the respective Hall elements 31 and 32 to be finely adjusted by the variable resistors 35 and 36. Therefore, the misalignment voltage $V_{HO}$ may be adjusted to zero. In the arrangement of FIG. 5, the control currents with the same direction are fed to two Hall elements 31 and 32 in a magnetic field. As a result, the Hall output voltages $V_{H31}$ and $V_{H32}$ have the same direction so that the output voltage $V_H$ when these are coupled is the sum of these with approximately double magnitude as compared with the single Hall element. In other words by this arrangement of FIG. 5, the total misalignment voltage may be adjusted to zero and the Hall output voltage has the double magnitude of the single one.

Figure 6:
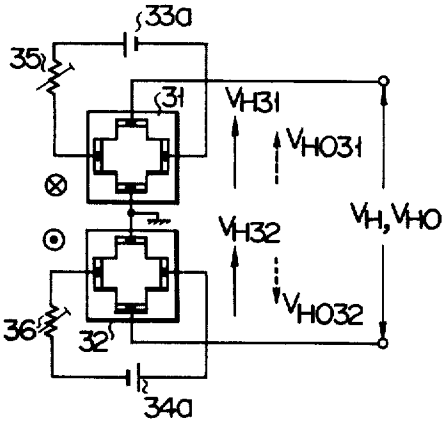
FIG. 6 shows a circuit diagram of a modification of the power-voltage converter shown in FIG. 5.

In case where the misalignment voltages of two Hall elements are in the same polarity, an arrangement as shown in FIG. 6 is employed to gain the effects similar to that of FIG. 5. In this example, two Hall elements 31 and 32 are placed in the bias magnetic fields of which the directions are opposite to each other. More particularly, the Hall element 31 is placed in the magnetic field which is normal to the paper surface and directed downward. The Hall element 32 is positioned in the magnetic field which is normal to the paper surface and directed upward. The control current of the Hall element 32 flows in the direction opposite to that of the FIG. 5 Hall element 32.

Figure 7:
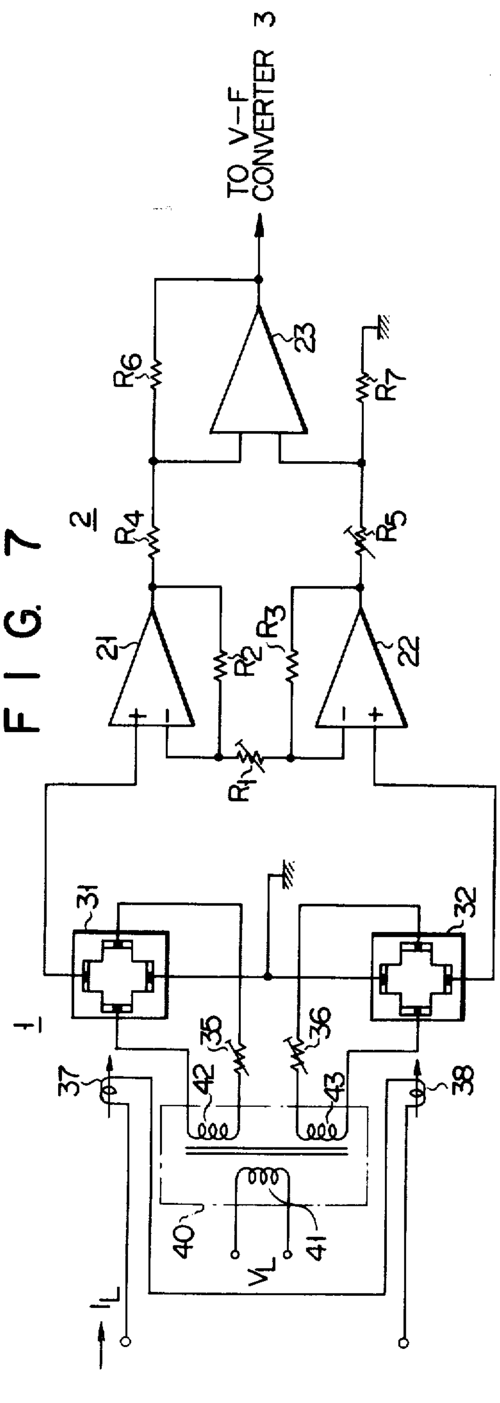
FIG. 7 shows a circuit diagram of still another modification of the power-voltate converter according to the present invention.

Reference will be made to FIG. 7 illustrating an embodiment of a watt-hour meter for measuring a single-phase AC power using a couple of Hall elements. The brief specification of each Hall element 31 and 32 is; the resistance between terminals R=1,200 ohms and the Hall output voltage $V_H$=22 mV/Kg.mA. In this example, these two Hall elements are so arranged to produce the Hall output voltages in the same direction and the misalignment voltages in the inverse direction under the condition that the applied magnetic fields and the fed control currents have the same direction, respectively, as shown in FIG. 5. One of the output terminals of the Hall element 31 is connected to the non-inverted input terminal of the operational amplifier 21, while the other output terminal is earthed and one of the output terminals of the Hall element 32 of which the other output terminal is connected to the non-inverted input terminal of the operational amplifier 22. The electromagnet coils 37 and 38 for generating the bias magnetic fields are connected in series to each other, permitting load current to flow therethrough. The winding directions of these coils 37 and 38 are such that the same directional magnetic fields are applied to the Hall elements 31 and 32. In this example, number of turns of each coil 37 and 38 is eight. A transformer 40 for two power sources is provided with a primary winding 41 coupling with the load voltage $V_L$ and with two secondary windings 42 and 43. The secondary winding 42 is connected to the control current input terminals of the Hall element 31, via a variable resistor 35. The other secondary winding 43 is connected to the control current input-terminals of the Hall element 32, via a variable resistor 36. More specifically, 100 V of single-phase, or the load voltage $V_L$, is applied to the primary winding 41. Several volts appears at each secondary winding 42 and 43. The resistance of each variable resistor 35 and 36 is 3 kiloohms.

The differential amplifier circuit 2 has the same construction as of the FIG. 2 embodiment.

With such a circuit construction, when the single-phase AC power is consumed in the load (not shown), the load current $I_L$ flows into the coils 37 and 38 so that the electromagnets produce magnetic fields corresponding to the load current $I_L$ which are in turn applied, as the same directional bias magnetic fields, to the Hall elements 31 and 32, correspondingly. The voltage proportional to the load voltage $V_L$ is produced from each secondary coil of the transformer 40 and the control current terminals of each Hall element 31 and 32 has the control current proportional to the load voltage $V_L$. The directions of the magnetic field and the control current as shown in FIG. 6 ensure similar effects.

FIG. 8 comparatively illustrates the variations of errors with respect to the load current of the watt-hour meter according to the invention and the conventional one. In the figure, the error variation by the device according to the invention is represented by a curve B and that of the conventional one by a curve A. As seen from the graph, the error by the device of the invention is remarkably reduced in the light load region, as compared with that of the conventional one.

The best way to minimize the misalignment voltage is to prepare a pair of Hall output terminals with the possibly best contrast. However, this method provides an adverse result that the misalignment voltages of the Hall elements thus produced exhibit different values in random variation ranging from negative to positive polarity. In other words, this method introduces difficulty in compensation for the misalignment voltage.

The explanation to follow is a case that a pair of Hall output terminals are intentionally formed to stabilize the polarity of the misalignment voltage and the misalignment voltage thereby is surely corrected. In this example, a couple of four-terminal Hall elements of which the misalignment voltages have fixed polarities, are disposed on a semiconductor substrate with a connection that these are connected in series of the Hall output terminals. And the control currents and magnetic fields are applied to the corresponding Hall elements in order that the misalignment voltages of the Hall elements used are cancelled each other and the summed Hall output voltage is produced.

Referring now to FIG. 9, there are shown two four-terminal Hall elements formed on a semi-insulating substrate of GaAs 50. The Hall elements are prepared through photo-etching of an epitaxial n-type GaAs layer grown thereon. These two Hall elements are designated by reference numerals 51 and 52, respectively. A common electrode 53 connects one of the Hall output terminals of the Hall element 51 with the same of the Hall element 52. The other Hall output terminals of them are connected to output electrodes 54 and 55, respectively. Each of the output electrodes 54 and 55 and the common electrode 53 are stepwise asymmetrical with respect to the control current path. With such an arrangement, the misalignment voltages of the Hall elements 51 and 52 are necessarily opposite in polarity. The Hall element 51 is provided with a couple control electrodes 56 and 57 being asymmetrical. Likewise, the Hall element 52 has a couple of asymmetrical control electrodes 58 and 59. The control electrode 56 is connected to one end of a variable resistor 60 of which the other end is connected to the control electrode 57 via a power source 62. This is true of a series circuit including the control electrodes 58 and 59, a variable resistor 61 and a power source 63. Two Hall elements 51 and 52 are connected in series through a common electrode 53 and produce the total Hall output $V_H$ between the remaining output terminals 54 and 55. The DC power sources 62 and 63 are so connected as to neutralize the misalignment voltages $V_{HO1}$ and $V_{HO2}$, as shown in the figure. The magnetic field H is normal to the paper face and directed downward, as shown.

Under a condition that the magnetic field H is zero and the polarities of the power sources 62 and 63 are set up as shown in the figure, when control currents are made to flow through the Hall elements 51 and 52, the respective Hall elements 51 and 52 produce at the output terminals misalignment voltages $V_{HO1}$ and $V_{HO2}$ with the polarities being opposite each other, due to asymmetrical configurations of the output terminals. These misalignment voltages $V_{HO1}$ and $V_{HO2}$ may be completely neutralized by controlling the control currents by the variable resistors 60 and 61, with the ground potential of the common Hall output electrode 53. As a result, no output voltage $V_H$ appears between the electrodes 54 and 55 due to cancellation of the misalignment voltages $V_{HO1}$ and $V_{HO2}$.

Figure 10:
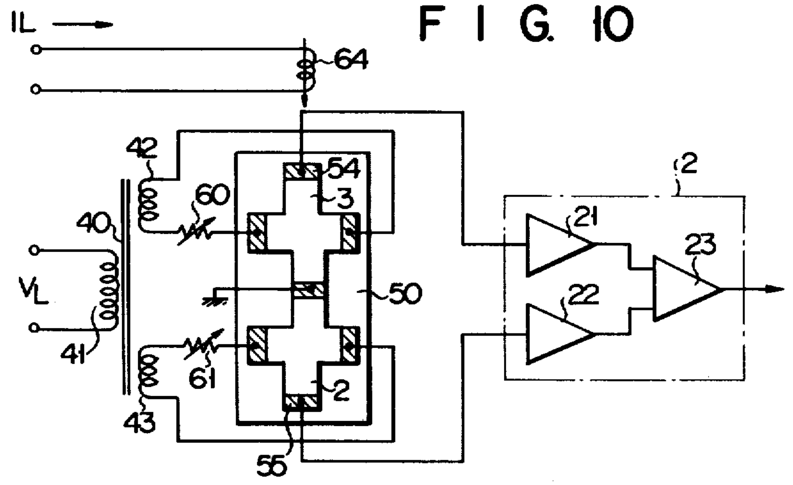

Turning now to FIG. 10, there is shown an embodiment of a watt-hour meter using the Hall element device shown in FIG. 9. In this example, a transformer 40 for two power sources as shown in FIG. 7 is used in place of the DC power sources 62 and 63 in FIG. 9. The load voltage $V_L$ is applied to the primary winding of the transformer 40. The secondary winding 42 is connected via a variable resistor 60 to the control electrodes 56 and 57. The same is correspondingly applied to the circuit connection of the secondary winding 57, a variable resistor 61 and control electrodes 58 and 59, as shown. A single electromagnet is used to develope a bias magnetic field and apply it onto the Hall elements 51 and 52. As a matter of course, the magnetic field H developed by the coil 64 is proportional to the load current $I_L$. This circuitry causes the Hall elements to produce from the output terminals 54 and 55 the Hall output proportional to the product of the load current $I_L$ and the load voltage $V_L$, which in turn is applied to the differential amplifier circuit 2 where the in-phase components are removed. As a consequence, the differential amplifier circuit 21 produces an output voltage representing the power amount consumed.

As will be seen from the above description, the FIG. 10 embodiment employs two Hall elements arranged in such a manner that they are disposed on a semiconductor substrate, with a common output terminal and other six terminals. Therefore, in the Hall elements arrangement of this example, the magnetic sensitive portions of them are disposed closer than the arrangement using two Hall elements each with four terminals so that these Hall elements are placed in much the same magnetic field strength. Further, atmospheric temperature difference between them may be minimized. Therefore, precision of the measurement is enhanced if it is used for instruments.

Figure 11:
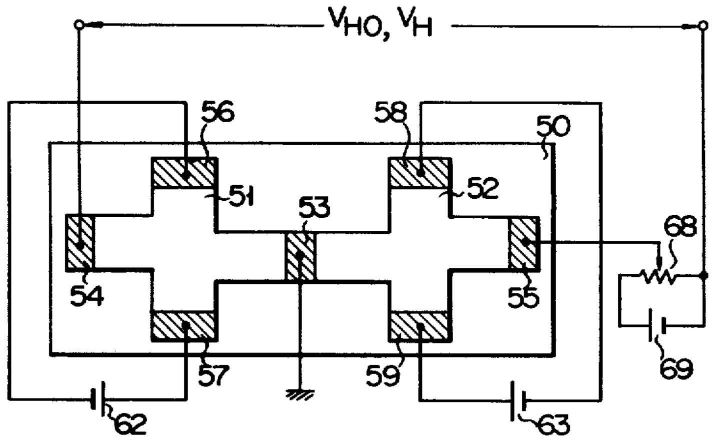

As described above, in the embodiment of FIG. 2, variable resistors are used to control the control currents of the respective Hall elements, with an intention of neutralizing the misalignment voltages developed by them. An alternate embodiment as shown in FIG. 11 is possible in which the DC power sources 62 and 63 are directly connected with the pairs of control terminals 56 and 57, and 58 and 59, respectively, and a variable resistor 68 and a DC bias source 69 are connected with the Hall output terminal 55, as shown in the figure. In this manner, the Hall output is exteriorly biased so that the misalignment voltages may be neutralized as a whole, even if the misalignment voltages of the Hall elements are different.

In the embodiments shown in FIGS. 10 and 11, two Hall elements 51 and 52 are separately disposed on one of the surfaces of the semiconductor substrate 50. Alternately, one of the Hall elements is disposed on one side of the semiconductor substrate while the other disposed on the other side thereof.

Figure 12:
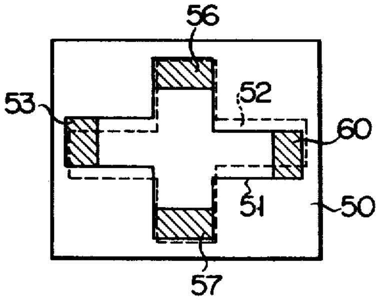

FIG. 12 is a model of such a Hall elements disposition. In the figure, reference numeral 50 designates a semi-insulating GaAs substrate doped with Cr and $O_2$ of which both sides have Hall elements 51 and 52, respectively. Each of the Hall elements is formed by photeetching an epitaxial n-type GaAs layer grown on the substrate. In the figure, the Hall element 52 formed on the reverse side of the substrate is indicated only of its configuration by a phantom line. Reference numerals 56 and 57 designate control current terminal electrodes of a Hall element 51, numeral 53 a common output electrode, numeral 60 another Hall output electrode. As seen from FIG. 12, a pair of Hall output terminals of the Hall element 51 formed on the obverse side of the substrate are asymmetrically stepped with respect to the control current path, as in the cases of FIGS. 10 and 11. This is true of the formation of a pair of Hall output terminals of the Hall element 52 on the reverse side of the substrate. As shown, these Hall elements 51 and 52 are disposed such that when one of the Hall elements is turned by 180° with respect to its pair of control current electrodes, more precisely, the axis passing through these electrodes, it is superposed on the other Hall element in a precise alignment.

Figure 13:
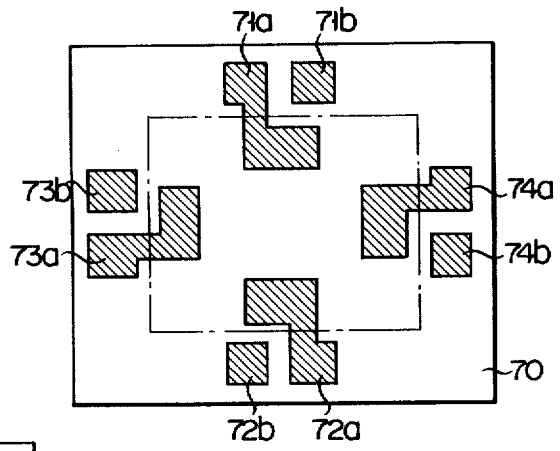
Figure 14:
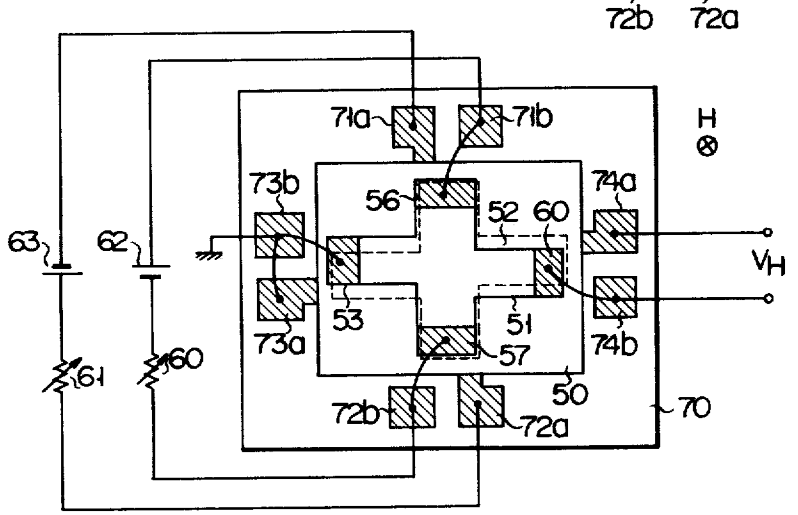

Thus constructed Hall elements wafer is mounted at the position defined by an alternate long and short dash line on a ceramic substrate 70 on which necessary terminal electrodes are previously vapor-deposited, as shown in FIG. 13. Electrodes 71*a* to 74*a* are electrodes used for the Hall element 52 on the reverse side of the substrate and the electrodes 71*b* to 74*b* for the Hall element 51 on the obverse side thereof. The terminal electrodes of the Hall element 52 are connected with the corresponding terminal electrodes 71*a* to 74*a* by thermocompression bonding the Hall elements wafer shown in FIG. 12 onto the ceramic substrate 70 at the position indicated by the alternate long and short dash line. On the other hand, the terminal electrodes 53, 56, 57 and 60 of the Hall element 51 are correspondingly connected to the terminals 73*b*, 71*b*, 72*b* and 74*b* by wire bonding connection, as shown in FIG. 14. The terminal electrodes 73*a* and 73*b* are connected each other by wire bonding so that the Hall output terminals of the Hall elements 51 and 52 are connected in series.

Then, a DC power source 63 and a variable resistor 61 are connected in series between the terminal electrodes 71*a* and 72*a*. Similarly, a DC power source 62 and a variable resistor 60 are connected in series between the terminal electrodes 71*b* and 72*b*. With such a connection, currents flowing through the obverse and reverse side Hall elements 51 and 52 are opposite in direction. Flowing of such currents and application of bias magnetic field H onto the Hall elements cooperate to cause them to produce the resultant Hall output voltage $V_H$ between the terminal electrodes 74*a* and 74*b*. Flowing of the opposite directional control currents into the Hall elements 51 and 52 formed on both sides of the Hall elements wafer 51, gives rise to neutralization of thermal-electromotive forces.

Figure 15:
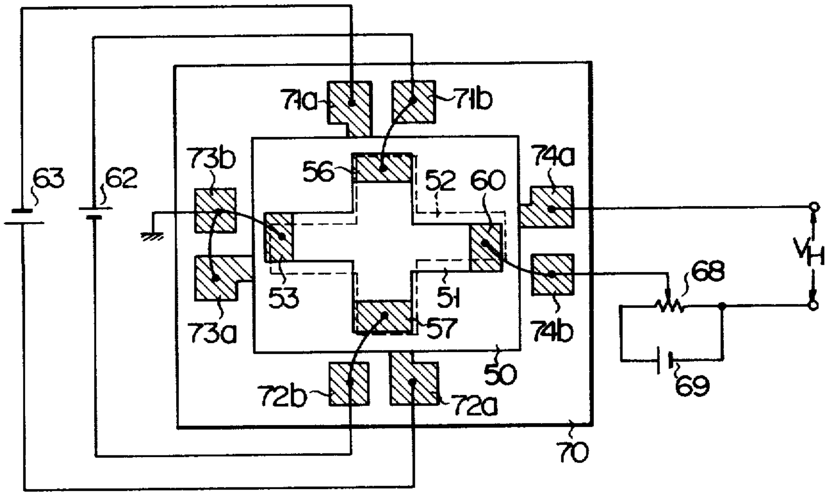

In the embodiment of FIG. 14, the misalignment voltages are adjusted by using the variable resistors 60 and 61, to neutralizing them to zero. Alternation as shown in FIG. 15 is allowed in which a variable resistor 68 and a bias power source 69 are connected with the Hall output terminal 74*b*.

As seen from the foregoing description, the modifications shown in FIGS. 5 through 15 all use a couple of Hall elements to eliminate the misalignment voltage and to produce the double Hall output voltage. A single Hall element may be used to compensate for the voltage. Such a scheme is shown by way of example in FIG. 16. The load current $I_L$ is fed to the coil 12 of an electromagnet which applies bias magnetic field onto the magnetic Hall 31 in the direction of the Hall output terminal axis. The load voltage $V_L$ is applied to the primary winding of the transformer 40 for double power sources. The secondary winding 42 with turn ratio 100:3, for example, is connected through a variable resistor, for example, of 2 kiloohms between the control current terminals of the Hall element 31. One of the control current terminals is earthed. One of the differential amplifier circuit 2 is connected to the non-inverted input terminal of the operational amplifier 21. The other output terminal of the Hall output terminals is connected to one end of the secondary winding 43 with turn ratio, for example, 200:1. A variable resistor of 200 ohms, for example, is connected between the terminals of the secondary winding 43. The movable terminal of the variable resistor 80 is connected with the non-inverted input terminal of the operational amplifier 22. The differential amplifier 2 is similar to those of FIGS. 1 and 7. The Hall element 31 used has the resistance between the Hall output terminals of 1,200 ohms and the Hall output voltage $V_H$ of 22 mV/Kg.mA. One of the Hall output terminals of the Hall element 31 and the movable terminal of the variable resistor 80 are connected between the input terminals of the differential amplifier circuit 2, as shown in the figure. The winding direction of the compensating coil 43 and the resistance of the variable resistor are so set up as to eliminate the misalignment voltage of the Hall element 31. This example of FIG. 16 is used for the AC load.

A modification suitable for DC load is shown in FIG. 17. As shown, the load voltage $V_L$ is reduced through a combination of resistors 81 and 82 and then is applied to the bias terminals of the Hall element 31. In this case, the compensating power source is comprised of a DC power source 83 and a potentiometer 80 for properly reducing the voltage from the power source.

FIGS. 18 and 19 show other modifications of the power-voltage converter, each of which is featured by two Hall elements and a power source. In the figures, illustrated are only means for feeding control current and the portion for taking out Hall output. The example of FIG. 18 is suitable for AC load and that of FIG. 19 for DC load.

In FIG. 18, the load voltage $V_L$, for example, AC 100 V is applied to the primary winding 86 of a three power sources transformer 85 and the first secondary winding of the transformer 85 produces 3 V which in turn is directly applied to the control current terminals of the Hall element 31. The 3 V voltage developed across the second secondary winding 88 is directly connected to the control current input terminals of the Hall element 32. The Hall element 31 is connected at one output terminal to one of the input terminals of the differential amplifier circuit while at the other output terminal connected to one of the Hall output terminals of the Hall element 32 and at the same time earthed. The other Hall output terminal of the Hall element 32 is connected to one end of the third secondary winding 89 and to the other end of the secondary winding 89 through the fixed terminals of the potentiometer 89. The movable terminal of the potentiometer 80 is connected to the other input terminal of the differential amplifier circuit.

In this example, the misalignment voltages of the Hall elements 31 and 32 may be eliminated by properly setting up the induced voltage of the third secondary winding 89, the winding direction of the same, and the output voltage of the potentiometer 80. Further, when the control currents' directions and the direction of the magnetic field are so selected as to cancel the misalignment voltages to each other, the compensation by the potentiometer is further enhanced.

In FIG. 19, DC power sources 33*a* and 34*a* are used for the control current sources of the Hall elements 31 and 32, respectively. One of the Hall output terminals of the Hall 31 is connected to the connection point between the anode of a Zenor diode 91 and the cathode of a Zenor diode 92. The cathode of the Zenor diode 91 is connected through a resistor of, for example, 1.5 kilo-ohms to +15 volts of a power source and to one of the fixed terminals of a variable resistor 93 of 1 kiloohm. The anode of the Zenor diode 92 is connected to −15 V of the power source via a resistor 94 of 1.5 kiloohms, and to the other fixed terminal of the potentiometer 93. The movable terminal of the potentiometer 93 is connected to one of the Hall output terminals of the Hall element 32.

The FIG. 19 circuit removes the misalignment voltages of the Hall elements 31 and 32 through adjustment of the resistance of the potentiometer 93.

What we claim is:

1. A multiplier comprising: a power-voltage converter including at least one Hall element with a pair of control current input terminals and a pair of Hall output voltage terminals, means for converting input current into magnetic field and applying the magnetic field onto said Hall element and means for converting input voltage to be multiplied by the input current into control current and for feeding the control current to said control current input terminals; and a differential amplifier circuit in which in-phase components in the output voltage fed from said power-voltage converter are removed and amplified;

wherein said differential amplifier comprises first and second operational amplifiers with non-inverted input terminals connected to said pair of Hall output voltage terminals, respectively, and a third operational amplifier with inverted and non-inverted input terminals connecting to the outputs of said first and second operational amplifiers.

2. A multiplier according to claim 1, in which said differential amplifier circuit further comprises a first variable resistor connected between the inverted input terminals of said first and second operational amplifiers, a first feedback resistor connected between the output terminal of said first operational amplifier and the inverted input terminal thereof, a second feedback resistor connected between the output terminal and the inverted input terminal of said second operational amplifier, whereby gain of said differential amplifier circuit may be changed by changing the ratio of the sum of said first and second feedback resistors to said first variable resistor, without common-mode rejection ratio (CMRR).

3. A multiplier according to claim 2, in which said differential amplifier circuit further comprises a first coupling resistor connected between the output of said first operational amplifier and the inverted input terminal of said third operational amplifier, a second coupling resistor connected between the output of said second operational amplifier and the non-inverted input terminal of said third operational amplifier, a third feedback resistor connected between the output of said third operational amplifier and the non-inverted input terminal thereof, and an earthing resistor connected between the non-inverted input terminal of said third operational amplifier and the ground.

4. A multiplier according to claim 1, in which said power-voltage converter comprises a Hall element, an electromagnet coil for developing bias magnetic field corresponding to a single-phase AC load current and applying the magnetic field onto said Hall element, a transformer having a secondary winding and a primary winding to which a single-phase AC load voltage is applied, means for applying the current induced in the secondary winding between the control current input terminals of said Hall element, and a variable resistor for adjusting the induced current which is inserted in series in the secondary winding.

5. A multiplier according to claim 1, in which said power-voltage converter comprises a first Hall element, a second Hall element, a first electromagnet coil for developing bias magnetic field corresponding to a phase current of three-phase AC current and applying the bias magnetic field onto said first all element, a second electromagnet coil for developing bias magnetic field corresponding to another phase current and applying the bias field onto said second Hall element, a first transformer with a primary winding to which one phase voltage of three-phase alternate current is applied and with a secondary winding connected between the control current terminals of said first Hall element, a second transformer with a primary winding to which another phase voltage of the three-phase alternate current is applied and with a secondary winding connected between the control current terminals of said second Hall element, and means for summing the Hall output voltages of said first and second Hall elements and applying the summation to said differential amplifier circuit.

6. A multiplier according to claim 1, in which said power-voltage converter comprises a first Hall element, a second Hall element, means for applying a common bias magnetic field to said first and second Hall elements, means for making DC control currents flow into said first and second Hall elements in the directions that the misalignment voltages by said first and second Hall elements are cancelled each other, and means for summing the Hall output voltages of said first and second Hall elements and applying the summation onto said first and second Hall elements.

7. A multiplier according to claim 1, in which said power-voltage converter comprises a first Hall element, a second Hall element, means for applying first and second magnetic fields being opposite in direction onto said first and second Hall elements, means for flowing DC control currents into said first and second Hall elements in the directions that misalignment voltages of said first and second Hall elements are cancelled each other, and means for summing the Hall output voltages of said first and second Hall elements and applying the summation to said differential amplifier.

8. A multiplier according to claim 1, in which said power-voltage converter comprises a first Hall element, a second Hall element, at least one electromagnet coil for applying bias magnetic fields onto said first and second Hall elements corresponding to single-phase AC load current, a transformer with a primary winding to which single-phase load voltage is applied, a first secondary winding connected between the control current terminals of said first Hall element and a second secondary winding connected between the control current terminals of said second Hall element, and means for summing the Hall output voltages of said first and second Hall elements and applying the summation to said differential amplifier circuit.

9. A multiplier according to claim 1, in which said power-voltage converter comprises a semiconductor substrate and first and second Hall elements which are formed on said semiconductor substrate, and one of the Hall output terminals of said each Hall element is connected each other and the other Hall output terminal of said each Hall element and said Hall element commonly connected are asymmetrically disposed.

10. A multiplier according to claim 8, in which said power-voltage converter including a semiconductor substrate and first and second Hall elements which are formed on said semiconductor substrate, and one of the Hall output terminals of said each Hall element is connected each other and the other Hall output terminal of said each Hall element and said Hall element commonly connected are asymmetrically disposed.

11. A multiplier according to claim 9, in which a compensating power source including DC power source and potentiometer is connected between one of the Hall output terminals of said first and second Hall elements and said differential amplifier circuit.

12. A multiplier according to claim 1, in which said power-voltage converter comprises a semiconductor substrate and first and second Hall elements which are formed on both sides of said semiconductor substrate have Hall output terminals disposed asymmetrically.

13. A multiplier according to claim 12, in which said power-voltage converter further comprises a first group of terminal electrodes formed on one of said semiconductor substrate and connected to terminal electrodes of said first Hall element, a ceramic substrate having a second group of terminal electrodes vapor-deposited thereon which are connected to terminal electrodes of second Hall elements formed on the other side of said semiconductor substrate by wire-bonding, and means connecting each of the Hall output terminals of said first and second Hall elements.

14. A multiplier according to claim 13, in which a compensating power source including DC power source and potentiometer is connected between one of the Hall output terminals of said first and second Hall elements and said differential amplifier circuit.

15. A multiplier according to claim 4, in which said transformer has a second secondary winding of which the induced voltage is applied as external compensation voltage to said Hall output voltage.

16. A multiplier according to claim 1, in which said power-voltage converter further comprises an external compensating voltage connected in series to the Hall output terminal of said Hall element.

* * * * *